(12) United States Patent
Plavec et al.

(10) Patent No.: US 9,929,641 B2
(45) Date of Patent: Mar. 27, 2018

(54) REGULATION CIRCUIT FOR A CHARGE PUMP AND METHOD OF REGULATION

(71) Applicant: EM MICROELECTRONIC MARIN S.A., Marin (CH)

(72) Inventors: Lubomir Plavec, Brno (CZ); Filippo Marinelli, Lussy-sur-Morges (CH)

(73) Assignee: EM MICROELECTRONIC MARIN S.A., Marin (CH)

( * ) Notice: Subject to any disclaimer, the term of this patent is extended or adjusted under 35 U.S.C. 154(b) by 240 days.

(21) Appl. No.: 14/460,040

(22) Filed: Aug. 14, 2014

(65) Prior Publication Data

US 2015/0063042 A1 Mar. 5, 2015

(30) Foreign Application Priority Data

Aug. 27, 2013 (EP) .................................... 13181894

(51) Int. Cl.
| | |
|---|---|
| *H02M 3/07* | (2006.01) |
| *G11C 5/14* | (2006.01) |
| *G11C 7/12* | (2006.01) |
| *G11C 7/14* | (2006.01) |
| *G11C 7/22* | (2006.01) |

(52) U.S. Cl.
CPC .............. *H02M 3/07* (2013.01); *G11C 5/145* (2013.01); *G11C 7/12* (2013.01); *G11C 7/14* (2013.01); *G11C 7/22* (2013.01); *H02M 3/073* (2013.01)

(58) Field of Classification Search
CPC ......... H02M 3/07; H02M 3/073; G11C 5/145; G11C 7/12; G11C 7/14; G11C 7/22
See application file for complete search history.

(56) References Cited

U.S. PATENT DOCUMENTS

| | | | | |
|---|---|---|---|---|
| 6,278,317 B1* | 8/2001 | Hsu | ....................... | H02M 3/073 327/536 |
| 6,300,839 B1 | 10/2001 | Bazargan et al. | | |
| 6,642,774 B1 | 11/2003 | Li | | |
| 7,551,507 B2* | 6/2009 | Nakai | ...................... | G11C 5/14 326/80 |
| 7,671,572 B2* | 3/2010 | Chung | .................. | H02M 3/156 323/243 |
| 7,902,905 B2* | 3/2011 | Maejima | ................. | H02M 3/07 327/534 |

(Continued)

FOREIGN PATENT DOCUMENTS

EP 0 822 477 A2 2/1998

OTHER PUBLICATIONS

European Search Report for EP 13181894.0, dated Jan. 27, 2014.

*Primary Examiner* — Jung Kim
(74) *Attorney, Agent, or Firm* — Sughrue Mion, PLLC

(57) ABSTRACT

The present invention relates to a regulation circuit for a charge pump and to a method of regulating a charge pump. The regulation circuit comprises
  a detector operable to analyze a temporal activity of the charge pump, and
  a pump clock generator coupled to an output of the detector and having an output coupled to a clock input of the charge pump to vary a pump clock frequency of the charge pump in dependence of the analysis of the detector, or
  a supply or voltage generator coupled to an output of the detector and having an output coupled to the charge pump to vary an amplitude of a clock signal within the charge pump in dependence of the analysis of the detector.

9 Claims, 4 Drawing Sheets

(56) References Cited

U.S. PATENT DOCUMENTS

2012/0230071 A1\* 9/2012 Kaneda ................. H02M 3/073
  363/59
2013/0200943 A1 8/2013 Vilas Boas et al.

\* cited by examiner

REGULATION CIRCUIT FOR A CHARGE PUMP AND METHOD OF REGULATION

This application claims priority from European Patent Application No. 13181894.0 filed 27 Aug. 2013, the entire disclosure of which is incorporated herein by reference.

FIELD OF THE INVENTION

The present invention relates to the field of regulation circuits and in particular to regulation circuits for a charge pump of a voltage regulator. Moreover, the invention relates to a respective method of regulating a charge pump.

BACKGROUND AND PRIOR ART

In applications with non-volatile memory units, charge pumps are typically used to provide a stable high-voltage level that is required to enable writing- or erasing-operations of the memory unit. For supplying a stable and constant voltage level, such charge pumps typically require regulation. In the absence of effective regulation, the charge pump output voltage may vary depending upon environmental conditions, electric load and the processing parameters under which the charge pump was fabricated. Among a variety of regulating circuits, capacitive or resistive dividers are widely used, by way of which a high voltage level on the output of the charge pump can be sensed for instance even in the absence of any static current load. Respective dividers are operable to divide the high voltage to a level which can be processed by a regulation or feedback loop that is typically operable to compare the downscaled voltage with a reference voltage.

Such feedback loops typically comprise a comparator having a first input connected to a node of the divider and having a second input connected to a reference voltage. The output of the comparator is typically coupled to or connected with the input of a charge pump. In the event, that the feedback loop detects a variation of the output voltage level of the charge pump, a respective and compensating control signal will be generated by the comparator. Such a regulation scheme is typically referred to as a continuous regulation, where the feedback loop changes the charge pump power continuously to achieve a desired output voltage level.

There also exists an ON/OFF regulation scheme, wherein the charge pump is regularly and alternately switched on and off. This regular switching of the charge pump inevitably leads to a rippled structure of the charge pump output voltage and also causes some current pulses on the power supply, which in turn causes noise on the supply voltage. These phenomena, the output voltage ripples and such current pulses are usually increasing with the charge pump power.

Up to a certain limit, the power of the charge pump is usually increasing with its operating frequency. However, the charge pump power efficiency is generally decreasing with an increase of the charge pump driving frequency. From this point of view, it is therefore desirable to drive the charge pump at a lowest possible frequency, which is just sufficient for the charge pump to generate a desired output voltage level. However, such an optimal frequency generally depends on the actual operation conditions, like charge pump output load, input supply voltage as well as on external conditions, such like temperature.

The U.S. Pat. No. 6,300,839 B1 describes an approach to adapt the charge pump frequency to varying operation conditions. There, a plurality of differential amplifiers is implemented, wherein each differential amplifier receives a different reference voltage as well as a common input voltage derived from the pumped voltage. A predetermined logic signal output by the differential amplifiers modifies, i.e. reduces, an original frequency of the oscillator. In this manner, the charge pump system may quickly compensate for any overshoot in the pumped voltage in a manner directly correlated to the magnitude of the pumped voltage.

If no differential amplifier outputs the predetermined logic signal, then the oscillator generates the original frequency. In this manner, the charge pump system also compensates for any undershoot in the pumped voltage by providing the fastest frequency. However, such a solution requires implementation of a series of differential amplifiers, which is rather space wasting and expensive. Moreover, such a solution does not seem to fulfill the demands for a miniaturized design of such regulation circuits.

Therefore, the regulation circuit in combination with the charge pump should just supply an output load which is needed by the specific application driven by the charge pump. This generally implies making use of a given relatively high frequency. However, most of the time, such a maximum output load is only required under rare worst case conditions, for instance at a maximum temperature. During most of the circuit lifetime, such high frequency is not needed but causes a non-optimal power efficiency of the charge pump.

SUMMARY OF THE INVENTION

It is therefore an object of the present invention to propose a new and beneficial regulation circuit providing an adaptive frequency regulation of the charge pump. Here it is a particular aim to provide a maximum frequency only in those instances when a correspondingly high power of the pump is actually needed. In this way, the present invention aims to save energy by always adaptively switching to a lowest possible driving frequency for the charge pump.

It is a further object of the invention to propose a regulation circuit providing an adaptive amplitude regulation of a clock signal used for the charge pump. The clock signal amplitude is adapted at a high level only when high power of the charge pump is needed, and the amplitude of clock signal is reduced in other cases.

It is a further object of the invention, that such a regulation circuit can be easily implemented in a space saving and cost efficient way.

In a first aspect of the invention a regulation circuit for a charge pump is provided. The regulation circuit comprises a detector which is operable to analyze a temporal activity of the charge pump. In particular, the detector is operable to detect and to analyze a temporal sequence of ON/OFF switching operations of the charge pump. Additionally, the regulation circuit comprises a pump clock generator that is coupled to an output of the detector. The pump clock generator further has an output that is coupled to a clock input of the charge pump. In this way, the pump clock generator may vary a pump clock frequency of the charge pump in dependence of the analysis of the detector.

In typical application scenarios, the detector analyzing the temporal activity of the charge pump is operable to generate some kind of control signal, such like a raise signal or a decrease signal to be transmitted to the pump clock generator. Upon receiving for instance of a raise signal from the detector, the pump clock generator switches to a higher pump clock frequency and as a consequence, the charge pump will then be driven by an increased pump clock frequency, thereby increasing the power and the load of the charge pump.

The inventive concept is based on the assumption that the analysis of the temporal activity, hence of the analysis of the sequence and duration of consecutive ON/OFF cycles of the charge pump is indicative on whether the output power of the charge pump is too low or even too high. If the detector detects, that the charge pump is hardly switched off or that the charge pump is almost permanently switched on, this is an indication, that the output power of the charge pump is too low. Upon detecting such a scenario the detector may generate a signal that induces a rise of the pump clock frequency provided by the pump clock generator.

It is here of particular benefit, that the regulation circuit can be implemented all digitally so that no analogue-digital conversion is necessary. Moreover, the analysis of the temporal activity of the charge pump as well as the implementation of an adaptive pump clock generation can be implemented on the basis of rather simple and cost efficient digital components, which also allow for a space saving arrangement and design.

According to an embodiment of the present invention the input of the detector is connectable to an output of a comparator being further coupled to an input of the charge pump. Typically, the input of the detector is connected to the comparator of the feedback loop that is operable to continuously regulate the output voltage level of the charge pump. By coupling the input of the detector to the output of the comparator, those time intervals can be precisely sensed and detected at which the charge pump is activated or switched on. As already indicated, depending on the duration of a continuous switch on state or depending on the commonness of such switch on operations occurrence of an insufficient or non-optimal output power of the charge pump can be determined.

In another embodiment, the detector is further operable to generate and to transmit a raise signal to the pump clock generator, which in response is operable to raise the pump clock frequency by a discrete step, typically by a predefined magnitude. The detector typically comprises a control logic, which upon detection of a particular temporal scheme of ON/OFF switches of the charge pump generates and transmits a raise signal, typically in form of a control pulse to the pump clock generator.

Upon receiving the raise signal from the detector, the pump clock generator is operable to raise the pump clock frequency. If the increase of the pump clock frequency is still not sufficient to drive the charge pump in an optimal condition, the regulation circuit, in particular the detector may repeatedly generate another raise signal, by way of which the pump clock frequency may be increased by another discrete step. Raising or lowering of a frequency in predefined discrete steps is easily implementable with purely digitally operating electronic components. The detector just analyzes the temporal sequence of ON/OFF switching operations of the charge pump and decides to regulate the pump clock frequency in predefined discrete steps.

It is possible that the detector is operable to generate and to transmit one raise signal or two raise signals successive in time to a charge pump supply generator or to a control voltage generator. Said generators are operable to raise a clock signal amplitude for the charge pump for example by a discrete step. In a first case, the amplitude of the charge pump clock signal is controlled by the changing of the supply voltage of the charge pump. In a second case, the amplitude of the charge pump clock signal is done by the limiting of the internal charge pump clock by a controlled voltage. For the two cases, the detector supplies at least one raise signal by a control logic, upon detection of a particular temporal scheme of ON/OFF switches of the charge pump.

According to another embodiment, the detector is operable to generate and to transmit the aforementioned raise signal to the pump clock generator or to the supply or voltage generator upon detection that the charge pump is continuously active over a predefined maximum activation time. Once the charge pump is active for a period of time exceeding a predefined maximum activation time, this is a clear indication, that the output power of the charge pump is too low and does not suit the actual load present at the output of the charge pump. In this embodiment, the detector is in particular operable to monitor the duration for which the charge pump is switched on. This can be implemented by some simple digital electronic components as they are well known to persons skilled in the art.

Here, the detector must be simply operable to detect a rising edge of an input signal of the charge pump or of a respective output signal of the comparator of the feedback loop and to start a counter. When the counter reaches a predefined maximum count, representing the predefined maximum activation time, the detector is then operable to generate and to transmit a respective raise signal to the pump clock generator or to the supply or voltage generator.

According to another embodiment, the pump clock generator is operable to autonomously lower a previously raised pump clock frequency after a predefined period of time. In this way, the regulation circuit automatically tends towards a lowest possible pump clock frequency. In such events, where lowering of the pump clock frequency is not suitable, the regulation circuit will repeatedly and immediately raise the pump clock frequency in a subsequent regulation cycle.

According to another embodiment, the charge pump supply generator or the controlled voltage generator is operable to autonomously lower a previously raised amplitude of a clock signal for the charge pump after a predefined time period. In this way, the regulation circuit automatically tends towards a lowest possible amplitude of the clock signal for operating the charge pump.

In another embodiment, the detector is operable to generate and to transmit a decrease signal to the pump clock generator. Upon receiving of such a decrease signal, the pump clock generator is operable to decrease the pump clock frequency, typically by a discrete step or even to a default value. Generation and signal processing of the decrease signal may directly correspond to generation and processing of a raise signal. However, here the detector is operable to detect situations or configurations in which the charge pump clock frequency is higher than it has to be to provide a requested output power or load.

In another embodiment, the detector is operable to generate and to transmit a decrease signal to the supply or controlled voltage generator. This allows reducing the amplitude of the clock signal for operating the charge pump in particular by a discrete step or even to a default value.

For generating a decrease signal the detector is typically operable to monitor the duration of an OFF period of the input signal of the charge pump. If the charge pump input signal should exhibit an OFF period exceeding a predefined maximum OFF time, the decrease signal is typically generated. Additionally or alternatively before generating a decrease signal, the detector may also be operable to compare the duration of an ON period or activation period of the input of the charge pump with a predefined minimum activation time. Since ON and OFF periods of the input signal of the charge pump complement each other the detector may either sense the occurrences and/or durations of either the ON periods or OFF periods of the charge pump input signal.

According to another embodiment, at least one of the detector and the pump clock generator are operable to decrease the pump clock frequency by a discrete step or to a default value upon detection that an operation of a memory circuit driven by the charge pump terminates, has terminated or is about to terminate. Typically, the charge pump has to provide a high level output voltage for a specific operation of a memory circuit or of a memory unit. In particular, a write or erase operation of the memory circuit requires a raised output voltage level of the charge pump. Therefore, a raised high output voltage level of the charge pump is only required during a particular write operation of the memory circuit driven by the charge pump. It is then of advantage, that duration of this particular operation of the memory circuit is tracked or sensed by either the detector or by the pump clock generator.

In the event that any one of the detector or the pump clock generator detects a termination of the operation of the memory circuit either the pump clock generator itself decreases the pump clock frequency stepwise or immediately to a default frequency level. Alternatively, if termination of the memory circuit operation is detected or tracked by the detector, the detector just generates a decrease signal as already described above. In this context it is even conceivable that the particular operation of the memory circuit typically lasts for a predefined time interval. In this case lowering or dropping of the previously raised voltage may equally take place after a predefined period of time has lapsed since the output of the charge pump has been raised to a particular high level.

In the case of adapting the amplitude of clock signal for the charge pump, the detector and the supply or controlled voltage generator are operable to decrease the amplitude of the clock signal by a discrete step or to a default value upon detection that an operation of a memory circuit driven by the charge pump terminates, has terminated or is about to terminate.

According to another embodiment, the detector is driven by a detector clock signal which is either generated by the detector itself or which is provided by a specific external clock generating unit. The detector clock signal defines sampling times at which the activity of the charge pump is checked by the detector. In this embodiment it is not required that the detector continuously tracks and monitors the input signal of the charge pump. It is sufficient, when the respective input signal is analyzed only at discrete sampling times that are defined by the frequency of the detector clock signal.

Here, the detector is operable to generate the raise signal upon detection that the charge pump is active at least at two consecutive sampling times or that the charge pump is continuously active during the time between two consecutive sampling times. Alternatively it is also conceivable, that a raise signal is generated only upon detection that the charge pump is active at least at three consecutive sampling times. The resolution and sensitivity of the regulation circuit may be easily adapted and modified according to various boundary conditions. For instance, the frequency of the detector clock signal may be subject to modifications, thereby changing the sensitivity and resolution of the charge pump clock signal frequency regulation.

In this embodiment, the detector is operable in a synchronous mode since it is driven by the periodic detector clock signal. Typically, the detector is operable to check the activity of the charge pump at the rising edge of the detector clock signal. Moreover, the detector clock signal typically features regular peaks that are equidistant in the time domain.

It is due to a comparison of the activity of the charge pump at consecutive sampling times to determine whether the output power of the charge pump matches with the actual load present at the charge pump. If the charge pump is for instance active at consecutive sampling times this may be an indication, that its output power is too low. In response to a detection that the charge pump is active for at least two consecutive sampling times, the detector is typically operable to generate a raise signal and to transmit the respective signal to the pump clock generator, which upon receiving said signal is operable to raise the pump clock frequency by a discrete step.

It is the same case for adapting the amplitude of the clock signal for the charge pump. In response to a detection that the charge pump is active for at least two consecutive sampling times, the detector is typically operable to generate a raise signal and to transmit the respective signal to the supply or controlled voltage generator in order to raise the amplitude of the clock signal.

According to another aspect, the invention also relates to an electronic device comprising a charge pump and a regulation circuit as described above. Typically, the electronic device comprises a portable electronic device, such like a memory device, a transponder or receiver device, such like an RFID chip, a mobile phone, a portable computing device or a watch.

In still another aspect, the invention also relates to a method of regulating a charge pump. Typically, said method corresponds to the operation of the above described regulation circuit and the charge pump coupled therewith. Said method comprises the steps of analyzing a temporal activity of the charge pump and varying of a pump clock frequency or amplitude of the charge pump in dependence of the temporal analysis of the charge pump. The temporal activity, hence the activation scheme of the charge pump over time can be easily analyzed by making use of a detector connected with a node located between the output of the comparator of the feedback loop and the input of the charge pump. Said detector which is either driven by a detector clock signal or not comprises an output to deliver at least a raise signal to a pump clock generator or to a supply or controlled voltage generator. The pump clock generator in turn is operable to modify the clock frequency at which the charge pump is driven, whereas the supply or controlled voltage generator in turn is operable to modify the amplitude of the clock signal at which the charge pump is driven. In this way, a rather simple, space saving, cost efficient and robust regulation of the charge pump clock frequency or amplitude can be provided. Moreover, the charge pump can be driven by the lowest possible clock frequency or amplitude while matching with actual power or load demands.

In a further embodiment the pump clock frequency or amplitude is raised by a discrete step upon detection that the charge pump is continuously active over a predefined maximum activation time. In situations where the charge pump power is too low, the pump clock frequency or amplitude will be raised by one or by several consecutive discrete steps until its power is adapted to the actual load requirements.

According to a further embodiment, raising of the charge pump frequency or amplitude by at least one discrete step takes place upon detection that the charge pump is active at least at two consecutive sampling times, wherein said sampling times are determined or defined by a detector clock signal. In this way, a discrete regulation and adaptation of the pump clock frequency or amplitude is implemented synchronous with the detector clock signal.

In a further embodiment the pump clock frequency or amplitude is autonomously lowered after a predefined time period has lapsed since the pump clock frequency or amplitude has been raised. In this way, the method provides a rather autonomous decreasing of the pump clock frequency or amplitude, so that the charge pump can be driven always at the lowest possible clock frequency or amplitude. In this way, power efficiency of the charge pump and of its feedback circuit can be improved and battery lifetime of a mobile device can be advantageously extended.

Additionally or alternatively, it is also conceivable, that the pump clock frequency or amplitude is lowered upon detection that the charge pump power output is too high or is higher than actually required. Hence, a decrease of the pump clock frequency or amplitude either by a discrete step or directly to a default value may take place upon detection that the charge pump is continuously inactive over a predefined period of time.

In still another embodiment of the method of regulating the charge pump, the pump clock frequency or amplitude is decreased by a discrete step or to a default value upon detection that an operation of a memory circuit that is driven by the charge pump terminates, has terminated or is about to terminate. In this way, decrease of the pump clock frequency or amplitude is coupled with an operation of a memory circuit, wherein said operation, typically a write operation requires a raised power output of the charge pump.

BRIEF DESCRIPTION OF THE DRAWINGS

In the following, various embodiments of the invention will be described by making reference to the drawings, in which.

DETAILED DESCRIPTION

Figure 1:
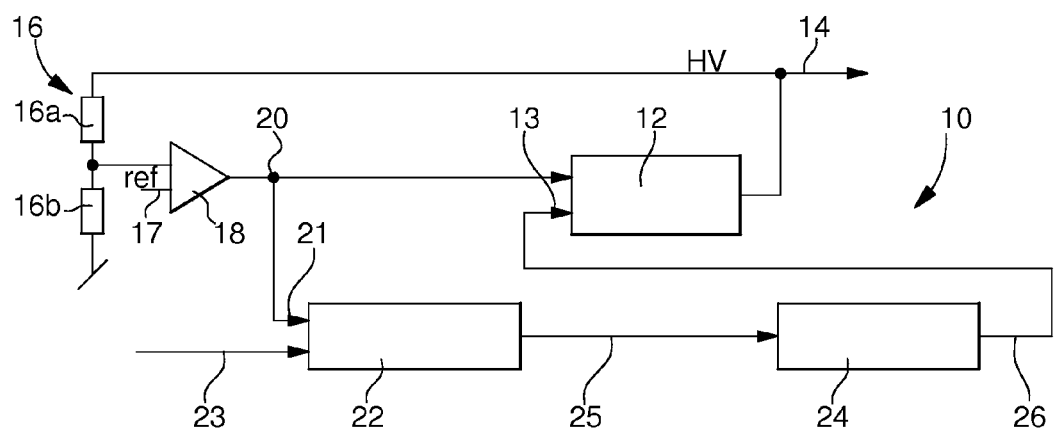
FIG. 1 shows a schematic diagram of the regulation circuit according to a first embodiment.

The regulation circuit 10 as illustrated in FIG. 1 is adapted to regulate the frequency of the clock signal driving a charge pump 12. The charge pump 12 features a high voltage HV output 14 by way of which a further electronic device or electronic unit, such like a memory circuit 60 can be driven. In particular, the charge pump 12 provides a comparatively high output voltage required by a memory circuit 60 to conduct a write or erase operation. In order to provide a stable output voltage, the charge pump 12 is coupled and controlled by a feedback loop.

The feedback loop comprises a voltage divider 16, which may either be capacitive or resistive. In the present embodiment two resistors 16a, 16b are arranged in series. A node between resistors 16a, 16b is coupled to an input of a comparator 18 having a further input coupled and connected to a reference voltage 17. In the event, that the output voltage level of the charge pump 12 is subject to a modification or fluctuation, such a change will be fed back to the input of the comparator 18, which is operable to generate a compensating output signal coupled to the input of the charge pump 12 in order to compensate such fluctuations.

Moreover, the charge pump 12 is driven by a clock signal generated by a pump clock generator 24. Here, the output 26 of the pump clock generator 24 is coupled to the clock input 13 of the charge pump 12. Operation of the charge pump 12 is clocked, which means, that the charge pump 12 is regularly switched on and off in a regular operation mode. By variations of the ratio of ON and OFF periods of the charge pump 12, the power of the charge pump 12 can be adapted to varying loads as well as to varying external conditions under which the charge pump 12 is driven. Generally and in order to provide a power efficient operation of the charge pump 12, the clock frequency at which the charge pump 12 is to be driven should be as low as possible.

The regulation circuit 10 further comprises a detector 22 having a detector output 25 that is connected with the input of the pump clock generator 24. An input 21 of the detector 22 is coupled with the output of the comparator 18. Hence, between the output of the comparator 18 and the input of the charge pump 12 there is provided a node 20 for connecting the input 21 of the detector 22 with the output of the comparator 18. In this way, the detector 22 is operable to track and to analyze the activity, hence the ON/OFF periods of the charge pump 12 over time. By means of this analysis provided by the detector 22 it can be determined, whether the charge pump power actually matches with actual or required load requirements.

In the embodiment according to FIG. 1 the detector 22 further comprises a clock input 23 in order to receive a detector clock signal generated by some additional clock generator. By means of the detector clock signal, the regulation circuit 10 can be driven in a synchronous mode. Typically, the detector clock signal defines regular or equidistant sampling times at which the activity of the charge pump 12 is detected or checked by the detector 22.

Figure 2:
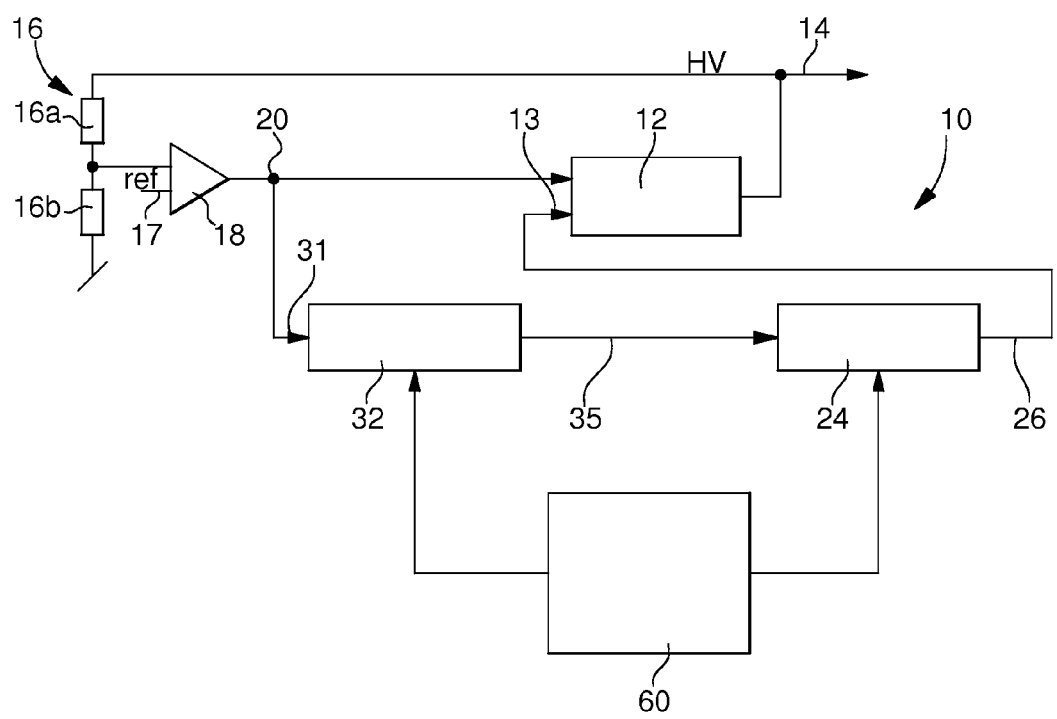
FIG. 2 is illustrative of a second embodiment of the regulation circuit.

The second embodiment according to FIG. 2 is rather similar to the embodiment as shown in FIG. 1 except that the detector 32 is not driven by an additional and external clock signal. Here, the input 31 of the detector 32 is connected to the node 20 in order to provide temporal analysis of ON and OFF periods of the charge pump 12. The detector 32 of the regulation circuit 10 according to FIG. 2 also comprises a detector output 35 connected with an input of the pump clock generator 24.

The memory circuit 60 as illustrated in FIG. 2 may be coupled or connected with at least one of the detector 32 and the pump clock generator 24. In this way, the actual operation mode of the memory circuit 60 can be communicated and transferred to either the detector 32 or to the pump clock generator 24. Hence a decrease of a previously raised frequency of the pump clock can be triggered.

Even though only illustrated in the embodiment according to FIG. 2 the memory circuit 60 may be equally coupled to the detector 22 and to the pump clock generator 24 of the regulation circuit 10 as shown in FIG. 1.

Figure 3:
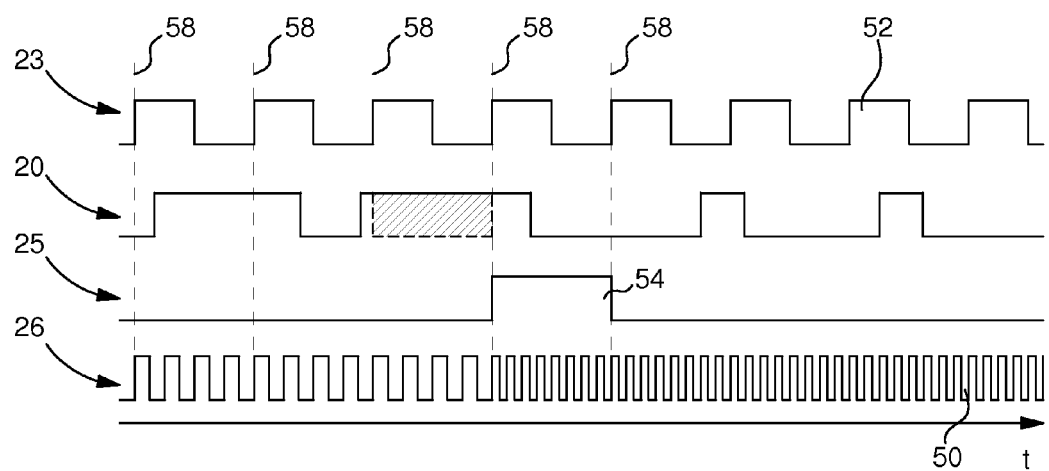
FIG. 3 shows a diagram of various signals of the circuit according to FIG. 1 over time.

In FIG. 3, a diagram of various signals as obtained with the regulation circuit 10 according to FIG. 1 is illustrated. In the top row of the diagram of FIG. 3 illustrates the clock input 23 of the detector 22 and shows the detector clock signal 52 driving the detector 22. The output of the comparator 18, hence the input of the charge pump 12 and as taken from the node 20 is shown in the second row. Underneath, in the third row there is illustrated the signal of the detector output 25 and the last row shows the signal of the pump clock generator output 26. The rectangular-shaped pulses of the detector clock signal 52 triggers the regular analysis of the charge pump input signal.

At the consecutive sampling times 58 as illustrated by the dashed lines in FIG. 3, which, for instance coincide with the rising edges of the detector clock signal 52, the detector 22 just checks and/or compares the actual status of the input signal of the charge pump 12 with predefined values. As illustrated in FIG. 3, at a first, hence at the outer most left sampling time 58, the input signal of the charge pump 12 is low. At a consecutive sampling time 58 the respective signal is high.

At a subsequent sampling time 58, hence at the third rising edge of the detector clock signal 52, the input signal of the charge pump 12 is still in an upper state but between the second and the third sampling time 58 the input of the charge pump 12 drops to the lower value. Hence, between the second and the third sampling time 58 activation of the charge pump 12 is interrupted at least for a while.

However, between the third and the fourth sampling time 58 as counted from the left hand side, the input signal of the charge pump 12 is constantly in the upper state, which is interpreted by the regulation circuit 10 that the output power of the charge pump 12 is too low in regard of the actual load. If the input signal of the charge pump 12 is constantly in the upper state between two consecutive sampling times 58, the detector 22 is operable to generate a raise signal 54 at the detector output 25. Upon generation and transmitting of the raise signal 54, the pump clock generator 24 is triggered to increase the charge pump clock frequency by a predefined discrete step as becomes apparent in the last line of the diagram of FIG. 3. As a consequence, and as can be seen at the node 20, the ratio of ON/OFF periods of the input signal of the charge pump 12 changes in that the OFF periods become longer at the expense of shorter ON periods.

The operation scheme as shown in FIG. 3 may be denoted as a synchronous operation mode of the regulation circuit 10 since detection or analysis of the input signal of the charge pump 12 only takes place at discrete points of time denoted as sampling time 58. By varying the frequency of the detector clock signal 52 the resolution and sensitivity of the present regulation circuit 10 can be adapted.

Figure 4:
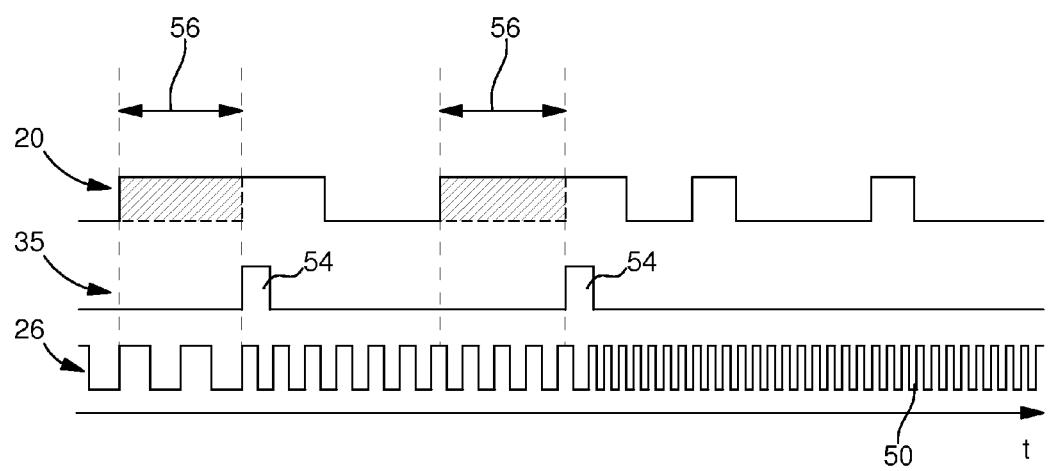
FIG. 4 shows a diagram of various signals of the regulation circuit according to FIG. 2 over time, FIG. 5 indicates an embodiment of a detector as used in the embodiment according to FIG. 1.

The diagram as illustrated in FIG. 4 is indicative of respective signals of the regulation circuit 10 as shown in FIG. 2. There and in contrast to the regulation circuit 10 of FIG. 1, the detector 32 is not driven by an external detector clock signal 52. Instead the detector 32 is operable to simply monitor ON periods and OFF periods of the input signal of the charge pump 12. Here, the total duration of the ON period is compared with a maximum activation time 56. In the event that the ON period of the charge pump 12 exceeds or equals the predefined maximum activation time 56, the detector 32 is operable to generate a raise signal 54 and to transmit the respective raise signal 54 to the pump clock generator 24. The clock generator 24 in turn may operate in the same way as described above and may just raise the charge pump clock frequency 50 by a predefined discrete step.

As for instance illustrated in FIG. 4, the initial increase of the pump clock frequency 50, as it is triggered by the first raise signal 54 may indeed increase the output power of the charge pump 12. However, this increased power output may still be insufficient to match the given load requirements. Therefore, the subsequent rising edge and the respective ON period of the input signal of the charge pump 12 is still larger than the predefined maximum activation time 56. As a consequence, the regulation circuit 10, and in particular the detector 32 is operable to further increase the pump clock frequency 50 by another discrete step. As a consequence, the ratio of ON and OFF periods of the input signal of the charge pump 12 remarkably changes which is an indication, that the charge pump 12 is now driven in such a way that its output matches with the actual load requirements.

It is to be noted that the detector 32 can include a counter to be started at the rising edge of the input signal from the node 20. If the input signal drops before the end of the activation time 56, there is no raise signal 54 in the output signal 35 from the detector without increasing the pump clock frequency. In this case, the counter can be reset at the end of activation time 56.

Typically and for reasons of energy efficiency, the regulation circuits 10 tend to switch to the lowest possible pump clock frequency 50. In general, there are various different ways on how to implement a frequency drop after the pump clock frequency 50 has been raised. In a first embodiment it is conceivable, that the pump clock generator 24 autonomously returns to a lower pump clock frequency 50 after a predefined period of time has lapsed since the pump clock frequency 50 has been raised. Alternatively, the detector 22 or 32 may detect that the charge pump 12 is driven with a pump clock frequency 50 that is simply too high in regard of actual load requirements. In such an event the detector 22 or 32 may generate a respective decrease signal to reduce the pump clock frequency 50, typically by a discrete step.

In still another alternative either the detector 22 or 32, or the pump clock generator 24, or both of said components are coupled with a memory circuit 60 that is driven by the charge pump 12. By means of such a coupling and at the end of a write or erase procedure of the memory circuit 60 typically requiring increased power, the memory circuit 60 may transmit a respective decrease signal to either the detector 32 or to the pump clock generator 24. As a consequence, the pump clock frequency 50 may either be decreased stepwise or may immediately return to a default value.

Figure 5:
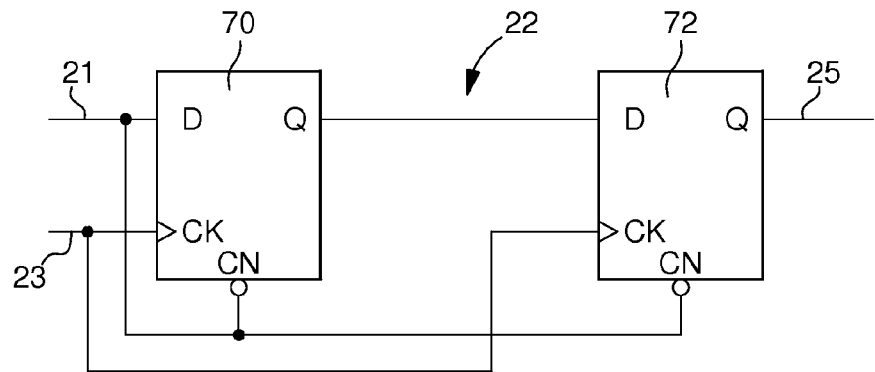

In FIG. 5 a typical implementation of a detector 22 is provided. This detector implementation is purely digital. The detector 22 for instance comprises a first flip-flop 70 and a second flip-flop 72 that are arranged and mutually coupled to form a kind of a shift register. The output of the second flip-flop 72 forms the output 25 of the detector 22, whereas the input 21 of the detector 22 is connected to both flip-flops 70, 72.

Figure 6:
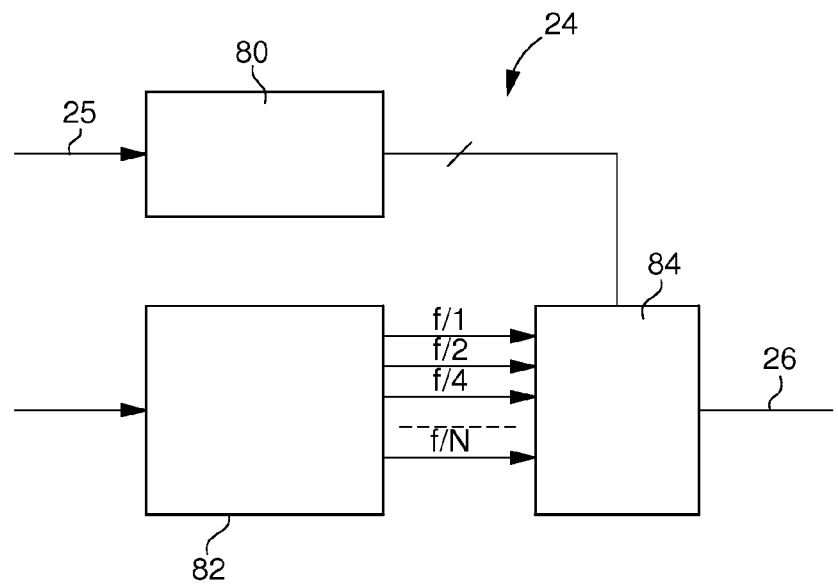
FIG. 6 is illustrative of a first embodiment of a pump clock generator.

In FIG. 6 a conceivable embodiment of the pump clock generator is illustrated. The pump clock generator 24 comprises a counter 80, a frequency divider 82 as well as a multiplexer 84. The frequency divider 82 is driven by some kind of an input clock not further illustrated here, whereas the counter 80 is connected with the output 25, 35 of the detector 22, 32. The signals of the frequency divider 82 as well as a signal of the counter 80 are provided to a multiplexer 84, which upon the actual counter state is operable to select one of the frequencies provided by the frequency divider. A particular frequency selected by the multiplexer 84 is then provided as the pump clock generator output 26.

Figure 7:
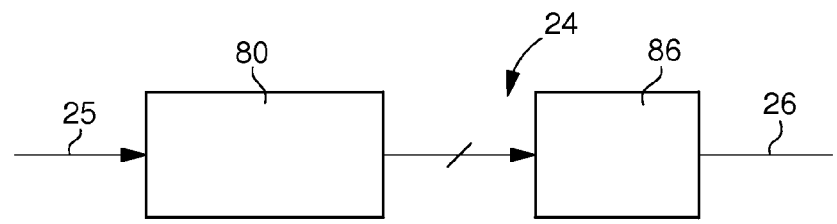
FIG. 7 shows a second embodiment of a pump clock generator.

In another embodiment as shown in FIG. 7, the pump clock generator 24 simply comprises a counter 80 in line with an oscillator 86. As already described in connection with FIG. 6, the counter 80 receives an output signal from the detector 22, 32 so as to select or to drive the oscillator 86 for generating a required pump clock frequency 50.

Figure 8:
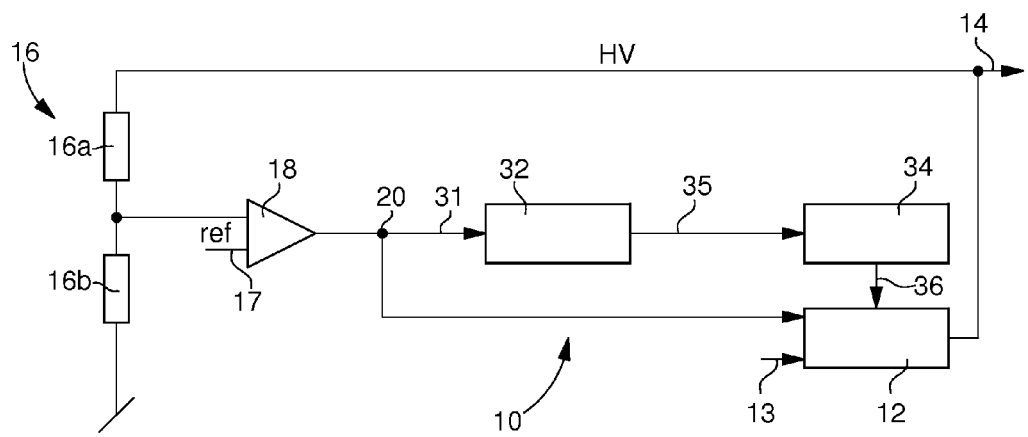
FIG. 8 shows a schematic diagram of the regulation circuit according to a third embodiment.

In FIG. 8 a third embodiment of the regulation circuit 10 is shown. Said regulation circuit 10 is adapted to regulate the amplitude of the clock signal for driving the charge pump 12 able to supply a high voltage HV at output 14 for example to drive a memory circuit 60 as previously explained. The clock signal in the charge pump is provided from the clock input 13 of the charge pump 12. To supply a stable output voltage, the charge pump 12 is coupled and controlled by a feedback loop in a similar manner as explained for the first and second embodiments of the regulation circuit 10 in FIGS. 1 and 2.

The feedback loop comprises a resistive or capacitive voltage divider 16. The voltage divider 16 can be provided with two resistors 16a, 16b arranged in series. The node between resistors 16a, 16b is coupled to an input of a comparator 18, whose a further input is coupled and connected to a reference voltage 17. In the event, that the output voltage level of the charge pump 12 is subject to a modification or fluctuation, such a change will be fed back to the input of the comparator 18, which is operable to generate a compensating output signal at the node 20 coupled to the input of the charge pump 12 in order to compensate such fluctuations in a similar manner as shown in FIGS. 1 and 2.

As the second embodiment according to FIG. 2, the regulator circuit 10 includes a detector 32 not driven by an additional and external clock signal. The input 31 of the detector 32 is connected to the node 20 to provide temporal analysis of ON and OFF periods of the charge pump 12.

The output 35 of the detector 32 is connected with an input of a charge pump supply generator 34, whose the output 36 is connected to the charge pump 12 in order to control and adapt the level of the supply voltage of said charge pump depending on the charge pump activity. By increasing or reducing the supply voltage of the charge pump, the amplitude of the clock signal within the charge pump can be automatically increased or reduced.

If the output power of the charge pump 12 is too low, the amplitude of the internal clock signal of the charge pump is increased as explained in the same manner by reference to the second embodiment of the regulation circuit 10 in FIG. 2. However if the output power of the charge pump 12 is too high, the amplitude of the internal clock signal of the charge pump is reduced.

The detector 32 is operable to generate and to transmit a raise signal at the output 35 to the charge pump supply generator 34 if the output power of the charge pump 12 is too low. With this raise signal for increasing the level of the supply voltage of the charge pump, the generator 34 is controlled upon the raise signal by a discrete step. The raise signal can be a control pulse as shown on FIG. 4. It can be selected one, two or more voltage levels in said supply generator 34, which can include a programmable capacitive or resistive divider of the supply voltage or a level shifter circuit.

It is to be noted that the charge pump supply generator 34 autonomously returns to lower supply voltage after a predefined period of time has lapsed since the supply voltage for the charge pump has been raised. The detector 32 may generate a respective decrease signal to reduce the supply voltage, typically by a discrete step.

It is also possible that the detector 32, or the charge pump supply generator 34, or both of said components are coupled with a memory circuit 60 that is driven by the charge pump 12. By means of such a coupling and at the end of a write or erase procedure of the memory circuit 60 typically requiring increased power, the memory circuit 60 may transmit a respective decrease signal to either the detector 32 or to the charge pump supply generator 34. As a consequence, the supply voltage for the charge pump 12 may be decreased stepwise or may immediately return to a default value.

Even if not illustrated by the drawings, it can be envisaged that the detector in the feedback loop to regulate the amplitude of the clock signal for driving the charge pump 12 can be clocked by a detector clock signal generated by some additional clock generator. By means of the detector clock signal, the regulation circuit 10 can be driven in a synchronous regulation mode.

Figure 9:
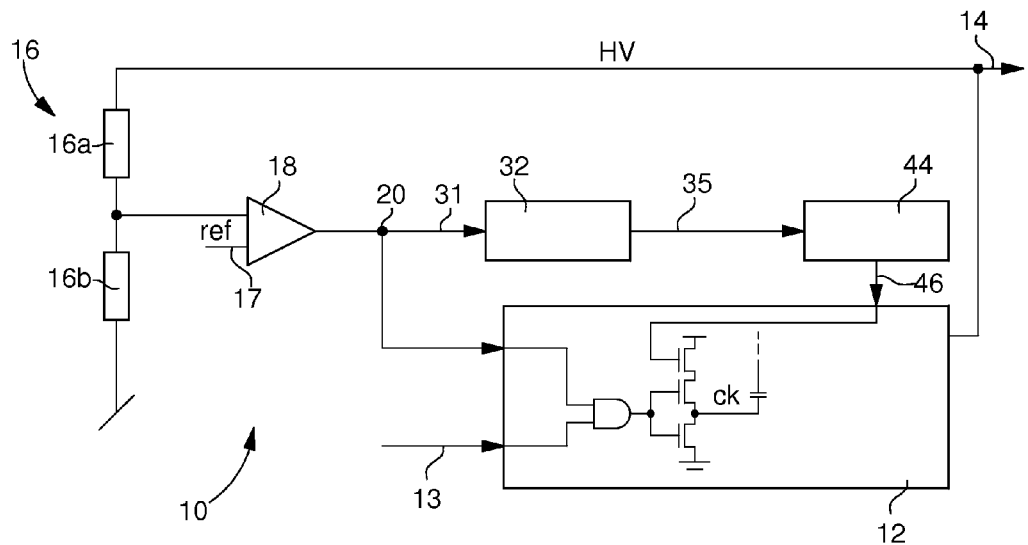
FIG. 9 shows a schematic diagram of the regulation circuit according to a fourth embodiment.

In FIG. 9 a fourth embodiment of the regulation circuit 10 is shown. As the third embodiment, said regulation circuit 10 is adapted to regulate the amplitude of the clock signal for driving the charge pump 12 able to supply a high voltage HV at output 14 for example to drive a memory circuit 60 as previously explained. The clock signal in the charge pump is provided from the clock input 13 of the charge pump 12. To supply a stable output voltage, the charge pump 12 is coupled and controlled by a feedback loop in a similar manner as explained for the first, second and third embodiments of the regulation circuit 10 in FIGS. 1, 2 and 8.

The difference of the fourth embodiment with respect to the third embodiment of the regulation circuit 10 is that the output 35 of the detector 32 is connected with an input of a controlled voltage generator 44, whose the output 46 is connected to the charge pump. A controlled voltage is supplied by the controlled voltage generator depending on the activity of the charge pump and is used to increase or to reduce the amplitude of an internal clock in the charge pump 12. By increasing or reducing the controlled voltage for the charge pump, the amplitude of the clock signal within the charge pump can be automatically increased or reduced.

As shown in part in FIG. 9, the controlled voltage from the generator 44 acts on a gate of a MOS transistor, which is connected in series with an inverter, composed of a PMOS transistor and a NMOS transistor between a supply voltage terminal and earth. Normally said transistor controlled by the controlled voltage can be a NMOS transistor. The node between said NMOS transistor and the inverter is an internal clock signal to activate the charge pump when the power output is too low. Generally an external clock signal is supplied at a clock input 13 of the charge pump. A signal from the node 20 at output of comparator 18 is combined with the external clock signal by an AND gate. Only if the signal from the node 20 is at high level for increasing the amplitude of the internal clock signal, a clock signal is generated inside the charge pump.

The controlled voltage generator 44 can be composed of a digital counter with a digital-analogue converter on the output for supplying the controlled voltage. One, two or more levels of the controlled voltage can be supplied to the controlled voltage generator on the basis on a raise or decrease signal from the detector 32.

As above-mentioned in the third embodiment, after having raised the controlled voltage, the voltage generator 44 can autonomously return to lower controlled voltage after a predefined period of time has lapsed. The detector 32 may generate a respective decrease signal to reduce the controlled voltage from the generator 44, typically by a discrete step.

The detector 32, or the controlled voltage generator 44, or both of said components can be coupled with a memory circuit 60 that is driven by the charge pump 12. By means of such a coupling and at the end of a write or erase procedure of the memory circuit 60 typically requiring increased power, the memory circuit 60 may transmit a respective decrease signal to either the detector 32 or to the controlled voltage generator 44. As a consequence, the controlled voltage for the charge pump 12 may either be decreased stepwise or may immediately return to a default value.

It is also possible to have the detector clocked by a detector clock signal generated by some additional clock generator. By means of the detector clock signal, the regulation circuit 10 can be driven in a synchronous regulation mode.

It is further to be noted, that various embodiments and variations of the present invention may exist. It should be appreciated that the exemplary embodiments are only examples, and are not intended to limit the scope, applicability, or configuration in any way. Hence, it is to be understood, that various changes may be made in the function and arrangement of elements described in an exemplary embodiment without departing from the scope as set forth in the appended claims and their legal equivalence.

What is claimed is:

1. A regulation circuit for a charge pump, said regulation circuit comprising in a feedback loop:
    a detector operable to analyze a temporal sequence of ON/OFF switching operations of the charge pump, wherein an input of the detector is connectable to an output of a comparator coupled to an input of the charge pump, and wherein the comparator is able to compare a reference voltage to a voltage divided by a voltage divider connected to an output of the charge pump,
    a pump clock generator coupled to an output of the detector and having an output coupled to a clock input of the charge pump to vary a pump clock frequency of the charge pump in dependence of the analysis of the detector,
    wherein the detector determines whether to vary the pump clock frequency based on whether the output of the comparator sampled according to a period of an external clock signal input into the detector indicates the charge pump to be continuously active for an entire ON/OFF switching cycle of the external clock signal.

2. The regulation circuit according to claim 1, wherein the detector is operable to generate and to transmit a raise signal to the pump clock generator if the output of the comparator indicates the charge pump to be continuously active for an entire ON/OFF switching cycle of the external clock signal, which in response is operable to raise the pump clock frequency by a discrete step.

3. The regulation circuit according to claim 1, wherein the detector is operable to generate and to transmit a raise signal to the pump clock generator, upon detection that the charge pump is continuously active for one or more entire ON/OFF switching cycles of the external clock signal.

4. The regulation circuit according to claim 1, wherein the pump clock generator is operable to autonomously lower the pump clock frequency after a predefined period of time period.

5. The regulation circuit according to claim 1, wherein the detector is operable to generate and to transmit a decrease signal to the pump clock generator, which in response is operable to decrease the pump clock frequency by a discrete step or to a default value.

6. The regulation circuit according to claim 1, wherein at least one of the detector and the pump clock generator is operable to decrease the pump clock frequency by a discrete step or to a default value upon detection that an operation of a memory circuit driven by the charge pump terminates, has terminated or is about to terminate.

7. The regulation circuit according to claim 1, wherein the detector is driven by the external clock signal defining sampling times at which the output of the comparator is sampled.

8. The regulation circuit according to claim 7, wherein the detector is operable to generate a raise signal upon detection that the charge pump is continuously active for at least a plurality of the entire ON/OFF switching cycles of the external clock signal.

9. An electronic device comprising a charge pump and a regulation circuit according to claim 1 and coupled to the charge pump.

* * * * *